(12) United States Patent
Zhao (10) Patent No.: US 11,675,239 B2
(45) Date of Patent: Jun. 13, 2023

(54) ARRAY SUBSTRATE AND DISPLAY DEVICE

(71) Applicants: Beijing BOE Display Technology Co., Ltd., Beijing (CN); BOE Technology Group Co., Ltd., Beijing (CN)

(72) Inventor: Weili Zhao, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/486,655

(22) Filed: Sep. 27, 2021

(65) Prior Publication Data

US 2022/0214586 A1      Jul. 7, 2022

(30) Foreign Application Priority Data

Jan. 6, 2021    (CN) .......................... 202110011934.5

(51) Int. Cl.
| | |
|---|---|
| G02F 1/1362 | (2006.01) |
| G02F 1/1343 | (2006.01) |
| H01L 27/12 | (2006.01) |
| G02F 1/1335 | (2006.01) |

(52) U.S. Cl.
CPC .... G02F 1/136286 (2013.01); G02F 1/13439 (2013.01); G02F 1/133514 (2013.01); G02F 1/133548 (2021.01); H01L 27/1244 (2013.01)

(58) Field of Classification Search
CPC ......... G02F 1/136286; G02F 1/133548; G02F 1/133514; G02F 1/13439; H01L 27/1244
USPC ............................................................ 349/96
See application file for complete search history.

(56) References Cited

U.S. PATENT DOCUMENTS

| | | | | |
|---|---|---|---|---|
| 11,048,118 B1* | 6/2021 | Liu | ................... | G02F 1/133531 |
| 2015/0187805 A1* | 7/2015 | Jang | ................... | G02F 1/134363 |
| | | | | 257/72 |

* cited by examiner

*Primary Examiner* — Edward J Glick
*Assistant Examiner* — William D Peterson
(74) *Attorney, Agent, or Firm* — IPro, PLLC (57) ABSTRACT

The present application provides an array substrate and a display device. The array substrate includes: a first substrate and a plurality of signal lines on the first substrate. The plurality of signal lines are arranged along a first direction; at least one of the plurality of signal lines include a plurality of signal sub-lines arranged at intervals along the first direction, the plurality of signal sub-lines are electrically connected, each of the plurality of signal sub-lines extends along a second direction, and the second direction intersects the first direction.

17 Claims, 2 Drawing Sheets

ARRAY SUBSTRATE AND DISPLAY DEVICE

CROSS-REFERENCE TO RELATED APPLICATIONS

The present application claims a priority to the Chinese patent application No. 202110011934.5 filed in China on Jan. 6, 2021, a disclosure of which is incorporated herein by reference in its entirety.

TECHNICAL FIELD

The present disclosure relates to the field of display technologies, and more particular, to an array substrate and a display device.

BACKGROUND

With continuous development of display technologies, liquid crystal displays (LCD) have been widely used in various fields. In order to better serve human eyes and restore the real world, the LCD technology continues to research and develop in directions of high resolution, high contrast, high color gamut and large size. In the related art, the LCD technology directly drives sub-pixels through an array substrate with signal lines arranged between adjacent sub-pixels. However, the signal lines will form dark regions, resulting in defective dark regions that can be clearly seen when switching between different viewing angles of 3D display.

SUMMARY

In a first aspect, one embodiment of the present disclosure provides an array substrate, including: a first substrate and a plurality of signal lines on the first substrate. The plurality of signal lines are arranged along a first direction; at least one of the plurality of signal lines include a plurality of signal sub-lines arranged at intervals along the first direction, the plurality of signal sub-lines are electrically connected, each of the plurality of signal sub-lines extends along a second direction, and the second direction intersects the first direction.

Optionally, the at least one of the plurality of signal lines further includes a transparent conductive layer; the transparent conductive layer is at one side of the plurality of signal sub-lines facing away from the first substrate; and the transparent conductive layer is electrically connected to the plurality of signal sub-lines, respectively.

Optionally, at least one part of the transparent conductive layer is filled between adjacent ones of the plurality of signal sub-lines.

Optionally, the at least one of the plurality of signal lines further includes a conductive connection portion; the conductive connection portion is electrically connected to first ends of the plurality of signal sub-lines, respectively; and/or, the conductive connection portion is electrically connected to second ends of the plurality of signal sub-lines, respectively.

Optionally, the conductive connection portion and the plurality of signal sub-lines are formed as an integral structure.

Optionally, the array substrate further includes: a plurality of pixel aperture regions arranged in an array on the first substrate; a wire-grid structure, wherein the wire-grid structure and the plurality of signal lines are arranged in the same layer and made of the same material, the wire-grid structure is insulated from the plurality of signal lines, and an orthographic projection of the wire-grid structure onto the first substrate is at least partially overlapped with an orthographic projections of the plurality of pixel aperture regions onto the first substrate.

Optionally, the plurality of pixel aperture regions are divided into a plurality of columns of pixel aperture regions, and each column of pixel aperture regions includes a plurality of pixel aperture regions arranged along the second direction. The wire-grid structure includes a plurality of first wire-grid patterns arranged at intervals along the first direction; each of the plurality of first wire-grid patterns extends along the second direction; the plurality of first wire-grid patterns are divided into a plurality of first wire-grid pattern groups; at least some of the first wire-grid pattern groups are corresponding to the plurality of columns of pixel aperture region in a one-to-one manner; and an orthographic projection of the first wire-grid pattern group onto the first substrate is at least partially overlapped with an orthographic projection of corresponding one column of pixel aperture regions onto the first substrate.

Optionally, the wire-grid structure includes a plurality of second wire-grid patterns; each of the plurality of second wire-grid patterns extends along the second direction; the plurality of second wire-grid patterns are divided into a plurality of groups of second wire-grid pattern groups; and each of the plurality of second wire-grid pattern groups includes a plurality of second wire-grid patterns arranged at intervals along the first direction; at least some of the plurality of second wire-grid pattern groups are corresponding to the plurality of pixel aperture regions in a one-to-one manner; and an orthographic projection of the second wire-grid pattern group onto the first substrate is at least partially overlapped with an orthographic projection of corresponding one pixel aperture region onto the first substrate.

Optionally, the array substrate further includes: a plurality of pixel electrodes; at least some of the plurality of pixel electrodes are corresponding to the plurality of pixel aperture regions in a one to one manner; and an orthographic projection of the pixel electrode onto first substrate is at least partially overlapped with an orthographic projection of corresponding one pixel aperture region onto the first substrate.

Optionally, the plurality of pixel electrodes includes a plurality of first pixel electrodes and a plurality of second pixel electrodes; the first pixel electrode and the second pixel electrode are in different layers; the second pixel electrode is closer to the first substrate than the first pixel electrode; the plurality of first pixel electrodes are divided into a plurality of columns of first pixel electrodes; each column of the first pixel electrodes includes a plurality of first pixel electrodes arranged along the second direction; the plurality of second pixel electrodes are divided into a plurality of columns of second pixel electrodes, each column of second pixel electrodes includes a plurality of second pixel electrodes arranged along the second direction; and an orthographic projection of one column of first pixel electrodes onto the first substrate, and an orthographic projection of one column of second pixel electrodes onto the first substrate are alternately arranged along the first direction.

Optionally, the plurality of pixel aperture regions are divided into a plurality of columns of pixel aperture regions, and each column of pixel aperture regions includes a plurality of pixel aperture regions arranged along the second direction; an orthographic projection of the signal line onto the first substrate is at least partially overlapped with an orthographic projection of one column of pixel aperture regions onto the first substrate, and is at least partially overlapped with an orthographic projection of one column of second pixel electrodes corresponding to another column of pixel aperture regions which is adjacent to the one column of pixel aperture regions, onto the first substrate.

Optionally, the array substrate further includes a first passivation layer and a second passivation layer; the first passivation layer is located between the second pixel electrode and the signal line; and the second passivation layer is located between the first pixel electrode and the second pixel electrode.

Optionally, in the first pixel electrode and the second pixel electrode that are adjacent in the first direction, an orthographic projection of the second pixel electrode onto the first substrate is at least partially overlapped with an orthographic projection of the first pixel electrode onto the first substrate.

Optionally, in the first pixel electrode and the second pixel electrode that are adjacent in the first direction, a length of the second pixel electrode in the first direction is greater than a length of the first pixel electrode in the first direction.

Optionally, the orthographic projection of the pixel aperture region onto the first substrate is within the orthographic projection of the corresponding one pixel electrode onto first substrate.

Optionally, the signal line includes a data line.

In a second aspect, one embodiment of the present disclosure provides a display device, including: an array substrate, a counter substrate, and a liquid crystal layer. The array substrate and the counter substrate are arranged opposite to each other, and the liquid crystal layer is between the array substrate and the counter substrate. The array substrate includes: a first substrate, and a plurality of signal lines on the first substrate; the plurality of signal lines are arranged along a first direction; at least one of the plurality of signal lines include a plurality of signal sub-lines arranged at intervals along the first direction, the plurality of signal sub-lines are electrically connected, each of the plurality of signal sub-lines extends along a second direction, and the second direction intersects the first direction. The counter substrate includes: a second substrate, and a plurality of color resist patterns arranged in an array on the second substrate; and among the plurality of color resist patterns, the color resist patterns adjacent to each other along the first direction are in contact with each other.

Optionally, the array substrate includes a wire-grid structure; the display device further includes: a first polarizer disposed on one side of the counter substrate facing away from the array substrate; an extension direction of a transmission axis of the first polarizer is perpendicular to an extension direction of a first wire-grid pattern or a second wire-grid pattern in the wire-grid structure.

Optionally, the wire-grid structure is reused as a second polarizer; and extension directions of transmission axes of the second polarizer and the first polarizer are perpendicular to each other.

Optionally, among the plurality of color resist patterns, the color resist patterns adjacent to each other in the first direction are in direct contact with each other.

In the technical solution provided in the present application, at least part of the signal lines includes a plurality of signal sub-lines arranged at intervals along the first direction, and the multiple signal sub-lines are electrically connected to each other, so that the signal lines have good signal transmission performance while having good light transmittance, thereby reducing an area of the dark regions formed by the signal lines. When the array substrate is applied to a display device, it can reduce moire phenomenon seen when switching between different viewing angles of 3D display of the pixel island design.

BRIEF DESCRIPTION OF THE DRAWINGS

The accompanying drawings are used to better understand the present application, and constitute a part of the present application. The exemplary embodiments of the present application and the description thereof are used to explain the present application, and do not constitute an improper limitation on the present application. In the drawings.

DETAILED DESCRIPTION

In order to further explain an array substrate and a display device according to embodiments of the present application, a detailed description will be given below in conjunction with the accompanying drawings of the specification.

The resolution of the LCD in the related art depends on sizes of transistors and electrodes in an array substrate, as well as process capabilities of color resist in a color filter substrate. Since it is still difficult to realize ultra-fine color resist layer process at present, in order to provide the LCD with a higher resolution, within the scope of the existing color resist process capabilities, the design of further subdividing sub-pixels under an identical color resist unit to form pixel islands, is usually used to ensure that the 3D display has better viewing angle continuity.

Figure 1:
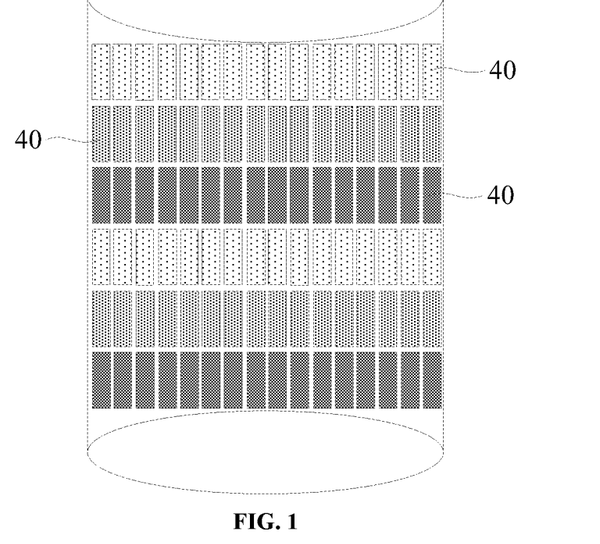
FIG. 1 is a schematic diagram of a pixel island according to an embodiment of the present application.
Figure 2:
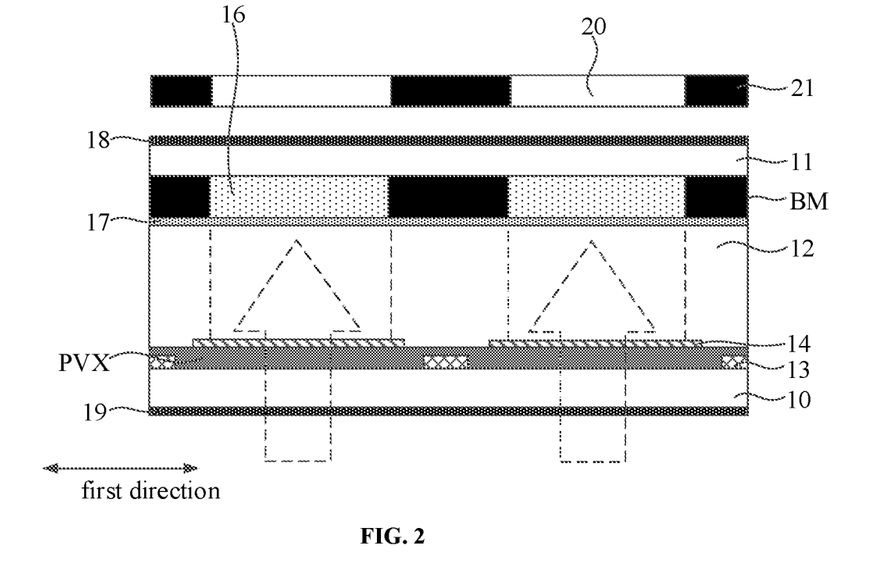
FIG. 2 is a schematic partial cross-sectional view of a display device in the related art.

More specifically, as shown in FIG. 1 and FIG. 2, one row of sub-pixels 40 of an identical color in FIG. 1 are corresponding to one color resist unit. In the related art, one color resist unit includes multiple color resist patterns, and a black matrix is arranged between adjacent color resist patterns. The color resist patterns are corresponding to sub-pixels 40 included in the corresponding row of sub-pixels 40 in a one-to-one manner. A black matrix is arranged between two adjacent color resist units.

FIG. 2 shows a schematic cross-sectional view of two sub-pixels. The vertical electric field driven liquid crystal display mode (such as ECB, TN) is taken as an example for schematic illustration. The display device includes an array substrate and a counter substrate that are arranged opposite to each other, and a liquid crystal layer 12 located between the array substrate and the counter substrate. The array substrate includes a lower substrate 10, a metal trace 13 disposed on the lower substrate 10, a passivation layer (PVX) covering the metal trace 13, and a pixel electrode 14 disposed on one side of the passivation layer away from the lower substrate 10. The counter substrate includes an upper substrate 11, a plurality of color resist patterns 16 arranged on one side of the upper substrate 11 facing the array substrate, a black matrix (BM) located between adjacent color resist patterns 16, and a common electrode layer 17 disposed on one side of the color resist patterns 16 and the black matrix facing the array substrate.

The display device further includes an upper polarizer 18 and a lower polarizer 19. The upper polarizer 18 is located on one side of the counter substrate away from the array substrate, and the lower polarizer 19 is located on one side of the array substrate away from the counter substrate.

FIG. 2 further shows that liquid crystal molecules are filled in an effective light-emitting area 20 and an ineffective light-emitting area 21, and dotted arrows represent a light-emitting direction of the display device.

It should be noted that, in order to show technical points of the present application more clearly, a TFT array layer for controlling pixel units on the array substrate as well as alignment layers on the array substrate and the counter substrate in conventional technical structures are not shown. Meanwhile, spacers supporting a cell thickness and sealant connecting the array substrate to the counter substrate are also not shown.

For the TN mode display device, alignment directions of alignment layers on the array substrate and the counter substrate are perpendicular to each other, so that liquid crystals are twisted by 90 degrees. Meanwhile, extension directions of transmission axes of the upper and lower polarizers are perpendicular to each other, and are consistent with orientations of adjacent liquid crystals. For the ECB mode display device, alignment directions of alignment layers on the array substrate and the counter substrate are parallel to each other; extension directions of transmission axes of the upper and lower polarizers are perpendicular to each other, and an angle between orientation of the liquid crystals and the transmission axes is 45°.

It is worth noting that the LCD technology directly drives sub-pixels through the array substrate, signal lines (such as metal traces) between the sub-pixels are opaque and will form dark regions, and thus defective dark regions (commonly known as moire phenomenon) can be clearly seen when switching between different viewing angles of 3D display of the pixel island design. In addition, a disturbing electric field formed between the signal line and the pixel electrode may cause abnormal deflection of the liquid crystals in a certain area, resulting in grayscale disorder. In order to prevent the grayscale disorder from affecting the viewing effect, a black matrix is provided on the color filter substrate at a position corresponding to a position between adjacent sub-pixels to block grayscale disordered areas. However, the introduction of the black matrix, like the signal line, will also cause discontinuity of light emission of the sub-pixels (i.e., generating black matrix dark regions), which aggravates the moire defect.

Figure 3:
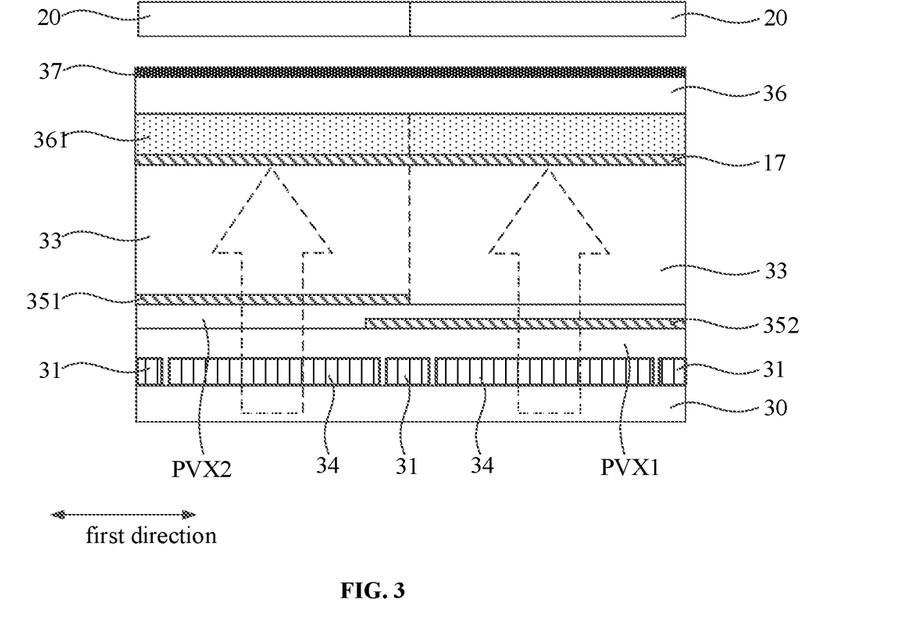
FIG. 3 is a first schematic partial cross-sectional view of a display device according to an embodiment of the present application.

In view of the foregoing problems, referring to FIG. 1 and FIG. 3, one embodiment of the present application provides an array substrate, including: a first substrate 30, and a plurality of signal lines 31 disposed on the first substrate 30.

The multiple signal lines 31 are arranged along a first direction. At least part of the signal lines 31 include a plurality of signal sub-lines arranged at intervals along the first direction. The multiple signal sub-lines are electrically connected. Each signal sub-line extends in a second direction, and the second direction intersects the first direction.

Exemplarily, the signal lines 31 are made of metal materials.

Exemplarily, the signal lines 31 include gate lines, data lines and/or power lines.

Exemplarily, the signal line 31 is located between two adjacent rows of sub-pixels 40; or the signal line 31 is located between two adjacent columns of sub-pixels 40.

Exemplarily, the signal line 31 is located at one side of one corresponding column of sub-pixels 40, and the one corresponding column of sub-pixels 40 includes a plurality of sub-pixels 40 arranged along the second direction.

Exemplarily, an orthographic projection of the signal line 31 onto the first substrate 30 intersects with orthographic projections of aperture regions of the sub-pixels 40 in the corresponding column of sub-pixels 40 onto the first substrate 30, respectively.

Exemplarily, the first direction includes a horizontal direction, and the second direction includes a direction perpendicular to the first direction (i.e., a direction perpendicular to the paper surface in FIG. 3).

Exemplarily, each signal line 31 includes a plurality of signal sub-lines arranged at intervals along the first direction. In one identical signal line 31, a distance between any two adjacent signal sub-lines is equal.

Exemplarily, each signal line 31 is formed like a wire-grid structure 34.

According to specific structures of the foregoing array substrate, in the array substrate provided in the embodiment of the present application, at least part of the signal lines 31 includes a plurality of signal sub-lines arranged at intervals along the first direction, and the multiple signal sub-lines are electrically connected to each other, so that the signal lines 31 have good signal transmission performance while having good light transmittance, thereby reducing an area of the dark regions formed by the signal lines 31. When the array substrate is applied to a display device, it can reduce moire phenomenon seen when switching between different viewing angles of 3D display of the pixel island design.

Figure 4:
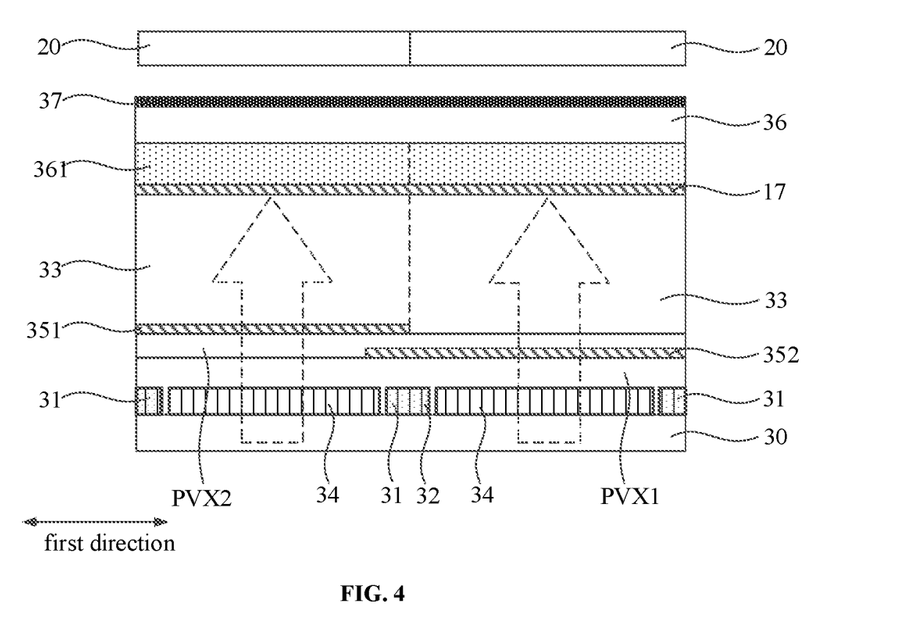
FIG. 4 is a second schematic partial cross-sectional view of a display device according to an embodiment of the present application.

As shown in FIG. 4, in some embodiments, at least part of the signal lines further includes a transparent conductive layer 32. The transparent conductive layer 32 is located at one side of the multiple signal sub-lines facing away from the first substrate 30. The transparent conductive layer 32 is electrically connected to the multiple signal sub-lines, respectively.

Exemplarily, the transparent conductive layer 32 is made of indium tin oxide material.

Exemplarily, the transparent conductive layer 32 covers multiple signal sub-lines included in one signal line.

Exemplarily, after the multiple signal sub-lines are fabricated on the first substrate 30, the transparent conductive layer 32 is formed on one side of the multiple signal sub-lines away from the first substrate 30. The transparent conductive layer 32 is electrically connected to the signal sub-lines, respectively, thereby realizing electrical connection of the multiple signal sub-lines belonging to the same signal line.

It is worth noting that the transparent conductive layer 32 is insulated from pixel electrodes in various sub-pixels 40 and the wire-grid structure 34 in the array substrate.

In the array substrate provided in the foregoing embodiment, the transparent conductive layer 32 is electrically connected with the multiple signal sub-lines, respectively, which not only ensures the electrical connection performance between the signal sub-lines included in the signal line, but also ensures the light transmittance of the signal line.

In some embodiments, at least part of the transparent conductive layer 32 is filled between the adjacent signal sub-lines.

The foregoing arrangement can ensure that the transparent conductive layer 32 better electrically connects the multiple signal sub-lines together.

In some embodiments, in one identical signal line, all of the transparent conductive layer 32 is filled between the adjacent signal sub-lines.

Exemplarily, in a direction perpendicular to the first substrate 30, a maximum thickness of the transparent conductive layer 32 is equal to a thickness of the signal sub-line.

The foregoing arrangement not only ensures that the transparent conductive layer 32 can better electrically connect the multiple signal sub-lines together, but also avoids increasing the thickness of the signal lines, which is beneficial to the thinning of the array substrate.

In some embodiments, the signal line further includes a conductive connection portion. The conductive connection portion is electrically connected to first ends of the multiple signal sub-lines, respectively; and/or, the conductive connection portion is electrically connected to second ends of the multiple signal sub-lines, respectively.

Exemplarily, a part of the conductive connection portion is located at a side where the first ends of the multiple signal sub-lines are located, and can be electrically connected to the first ends of the multiple signal sub-lines, respectively. The other part of the conductive connection portion is located at a side where the second ends of the multiple signal sub-lines are located, and can be electrically connected to the second ends of the multiple signal sub-lines, respectively.

Exemplarily, the conductive connection portion is made of indium tin oxide material.

Exemplarily, the conductive connection part is made of a metal material.

In the array substrate provided in the foregoing embodiment, the first ends of the multiple signal sub-lines are electrically connected by the conductive connection portion, and/or, the second ends of the multiple signal sub-lines are electrically connected by the conductive connection portion, which not only ensures the electrical connection performance between the signal sub-lines included in the signal line, but also ensures the light transmittance of the signal line.

In some embodiments, the conductive connection portion and the multiple signal sub-lines are provided as an integral structure.

The foregoing arrangement enables the conductive connection portion and the multiple signal sub-lines to be formed in the same patterning process, thereby effectively simplifying the manufacturing process of the array substrate and reducing the manufacturing cost.

As shown in FIG. 3 and FIG. 4, in some embodiments, the array substrate further includes:

a plurality of pixel aperture regions 33, where the multiple pixel aperture regions 33 are distributed in an array on the first substrate 30;

a wire-grid structure 34 arranged in the same layer and made of the same material as the signal line, where the wire-grid structure 34 is insulated from the signal line, and an orthographic projection of the wire-grid structure 34 onto the first substrate 30 at least partially overlaps with an orthographic projection of the multiple pixel aperture regions 33 onto the first substrate 30.

Exemplarily, the pixel aperture region 33 is an effective light-emitting area.

Exemplarily, the wire-grid structure 34 includes a metal wire-grid structure.

Exemplarily, there is a predetermined distance between the wire-grid structure 34 and the signal line to prevent the wire-grid structure 34 and the signal line 31 from being shorted together.

The wire-grid structure 34 is disposed on the array substrate with an extension direction of a transmission axis of the wire-grid structure 34 being perpendicular to the extension direction of the transmission axis of the upper polarizer 37, so that the wire-grid structure 34 can be reused as a lower polarizer.

In the array substrate provided in the foregoing embodiment, by effectively fusing the wire-grid structure 34 and the signal line, a good down-polarization function is realized, so that when the array substrate is applied to a display device, a lower polarizer disposed on one side of the first substrate 30 facing away from the counter substrate in the array substrate can be omitted, which facilitates reduction of the thickness of the display device.

In addition, by arranging the wire-grid structure 34 and the signal line in the same layer and made of the same material, the wire-grid structure 34 and the signal line can be formed in the same patterning process, thereby simplifying the manufacturing process of the array substrate and reducing the manufacturing cost.

In some embodiments, the multiple pixel aperture regions 33 are divided into a plurality of columns of pixel aperture regions 33. Each column of pixel aperture regions 33 includes a plurality of pixel aperture regions 33 arranged along the second direction.

The wire-grid structure 34 includes a plurality of first wire-grid patterns arranged at intervals along the first direction. Each first wire-grid pattern extends along the second direction. The multiple first wire-grid patterns are divided into multiple groups of first wire-grid pattern groups. At least part of the first wire-grid pattern groups are corresponding to the multiple columns of pixel aperture regions 33 in a one-to-one manner. An orthographic projection of the first wire-grid pattern group onto the first substrate 30 is at least partially overlapped with an orthographic projection of one corresponding column of pixel aperture regions 33 onto the first substrate 30.

Exemplarily, in each first wire-grid pattern group, a distance between adjacent first wire-grid patterns is equal to a distance between adjacent signal sub-lines in one identical signal line.

Exemplarily, a width of the first wire-grid pattern in a direction perpendicular to its own extension direction, is equal to a width of the signal sub-line in a direction perpendicular to its own extension direction.

Exemplarily, a length of the first wire-grid pattern in the second direction is equal to, a length of the signal sub-line in the second direction.

Exemplarily, an orthographic projection of the first wire-grid pattern group onto the first substrate 30 is overlapped with orthographic projections of multiple pixel aperture regions 33 in the one corresponding column of pixel aperture regions 33 onto the first substrate 30, respectively.

In some embodiments, the wire-grid structure 34 includes a plurality of second wire-grid patterns. Each second wire-grid pattern extends along the second direction. The multiple second wire-grid patterns are divided into multiple groups of second wire-grid pattern groups. Each second wire-grid pattern group includes multiple second wire-grid patterns arranged at intervals along the first direction. At least part of the second wire-grid pattern groups are corresponding to the pixel aperture regions 33 in a one-to-one manner. An orthographic projection of the second wire-grid pattern group onto the first substrate 30 is at least partially overlapped with an orthographic projection of one corresponding column of pixel aperture regions 33 onto the first substrate 30.

Exemplarily, in each second wire-grid pattern group, a distance between adjacent second wire-grid patterns is equal to a distance between adjacent signal sub-lines in one identical signal line.

Exemplarily, a width of the second wire-grid pattern in a direction perpendicular to its own extension direction, is equal to a width of the signal sub-line in a direction perpendicular to its own extension direction.

Exemplarily, a length of the second wire-grid pattern in the second direction is equal to, a length of the pixel aperture region 33 in the second direction.

In some embodiments, the array substrate further includes: a plurality of pixel electrodes (including a first pixel electrode 351 and a second pixel electrode 352). At least some of the pixel electrodes are corresponding to the pixel aperture regions 33 in a one-to-one manner. An orthographic projection of the pixel electrode onto the first substrate 30 is at least partially overlapped with an orthographic projection of the corresponding pixel aperture region 33 onto the first substrate 30.

Exemplarily, the orthographic projection of the pixel electrode onto the first substrate 30 coincides with the orthographic projection of the corresponding pixel aperture region 33 onto the first substrate 30.

Exemplarily, an area of the orthographic projection of the pixel electrode onto the first substrate 30, is greater than an area of the orthographic projection of the corresponding pixel aperture region 33 onto the first substrate 30.

Exemplarily, the orthographic projection of the pixel aperture region 33 onto the first substrate 30 is located within the orthographic projection of the corresponding pixel electrode onto the first substrate 30.

Exemplarily, the orthographic projection of the pixel electrode onto the first substrate 30 encloses the orthographic projection of the corresponding pixel aperture region 33 onto the first substrate 30.

Exemplarily, the pixel electrode is made of indium tin oxide material.

As shown in FIG. 3 and FIG. 4, in some embodiments, the multiple pixel electrodes includes multiple first pixel electrodes 351 and multiple second pixel electrodes 352. The first pixel electrode 351 and the second pixel electrode 352 are arranged in different layers. The second pixel electrodes 352 are closer to the first substrate 30 than the first pixel electrodes 351.

The multiple first pixel electrodes 351 are divided into multiple columns of first pixel electrodes 351. Each column of first pixel electrodes 351 includes multiple first pixel electrodes 351 arranged along the second direction. The multiple second pixel electrodes 352 are divided into multiple columns of second pixel electrodes 352. Each column of second pixel electrodes 352 includes multiple second pixel electrodes 352 arranged along the second direction. An orthographic projection of one first pixel electrode column onto the first substrate 30, and an orthographic projection of one second pixel electrode column onto the first substrate 30, are alternately arranged along the first direction.

It should be noted that the first pixel electrode column is one column of first pixel electrodes 351, and the second pixel electrode column is one column of second pixel electrodes 352.

Exemplarily, the multiple pixel aperture regions 33 include first pixel aperture regions 33 and second pixel aperture regions 33. The multiple first pixel electrodes 351 are corresponding to the first pixel aperture regions 33 in a one-to-one manner. The multiple second pixel electrodes 352 are corresponding to the second pixel aperture regions 33 in a one-to-one manner.

Exemplarily, both the first pixel electrode 351 and the second pixel electrode 352 are made of indium tin oxide material.

Exemplarily, the array substrate further includes a first passivation layer PVX1 and a second passivation layer PVX2. The first passivation layer PVX1 is located between the second pixel electrode 352 and the signal line 31. The second passivation layer PVX2 is located between the first pixel electrode 351 and the second pixel electrode 352.

Exemplarily, the orthographic projection of the first pixel electrode column onto the first substrate 30 does not overlap with an orthographic projection of an adjacent second pixel electrode column onto the first substrate 30.

Exemplarily, the orthographic projection of the first pixel electrode column onto the first substrate 30 is at least partially overlapped with the orthographic projection of the adjacent second pixel electrode column onto the first substrate 30.

In some embodiments, the orthographic projection of the signal line onto the first substrate 30 is at least partially overlapped with the orthographic projection of the first pixel electrode 351 onto the first substrate 30; and/or, the orthographic projection of the signal line onto the first substrate 30 is at least partially overlapped with the orthographic projection of the second pixel electrode 352 onto the first substrate 30.

Exemplarily, the orthographic projection of the signal line onto the first substrate 30 is at least partially overlapped with the orthographic projection of one column of first pixel electrodes 351 onto the first substrate 30; and/or, the orthographic projection of the signal line onto the first substrate 30 is at least partially overlapped with the orthographic projection of one column of second pixel electrodes 352 onto the first substrate 30.

In some embodiments, the multiple pixel aperture regions 33 are divided into multiple columns of pixel aperture regions 33, and each column of pixel aperture regions 33 includes multiple pixel aperture regions 33 arranged along the second direction.

The orthographic projection of the signal line onto the first substrate 30 is at least partially overlapped with an orthographic projection of one column of pixel aperture regions 33 onto the first substrate 30, and is at least partially overlapped with an orthographic projection of one column of second pixel electrodes 352 corresponding to another column of pixel aperture regions 33 which is adjacent to the one column of pixel aperture regions 33, onto the first substrate 30.

Exemplarily, the orthographic projection of the signal line onto the first substrate 30 is at least partially overlapped with an orthographic projection of one column of first pixel electrodes 351, which is corresponding to one column of pixel aperture regions 33, onto the first substrate 30.

Exemplarily, in one column of second pixel electrodes 352 corresponding to another column of pixel aperture regions 33 which is adjacent to the one column of pixel aperture regions 33, an orthographic projection of at least part of the second pixel electrodes 352 onto the first substrate 30, is at least partially overlapped with an orthographic projection of at least part of the pixel aperture regions 33 in the one column of pixel aperture regions 33, onto the first substrate 30.

Exemplarily, the orthographic projection of the signal line onto the first substrate 30 does not overlap with the orthographic projection of another column of pixel aperture regions 33 which is adjacent to the one column of pixel aperture regions 33, onto the first substrate 30.

The foregoing arrangement enables the signal line to be shielded by the second pixel electrodes 352, which can avoid formation of a crosstalk electric field between the signal line and the first pixel electrode 351, thereby preventing the signal line from interacting with liquid crystal molecules in the pixel aperture region 33 corresponding to the first pixel electrode 351. Further, since the orthographic projection of the signal line onto the first substrate 30 does not overlap with the orthographic projection of another column of pixel aperture regions 33 which is adjacent to the one column of pixel aperture regions 33, onto the first substrate 30, there is no interference to the liquid crystal molecules in another adjacent column of pixel aperture regions 33, thereby ensuring the display quality of the display device and avoiding the grayscale disorder.

When the array substrate provided in the above embodiments and a color filter substrate are assembled into a display device, since the signal line has good light transmittance and will not interfere with deflection of liquid crystal molecules, thereby ensuring display continuity. Therefore, in one color resist unit of the color filter substrate, adjacent color resist patterns may be in direct contact, that is, there is no need to provide a black matrix between adjacent color resist patterns (i.e., at positions corresponding to positions between adjacent sub-pixels 40), thereby avoiding discontinuity of light emission (i.e., generating black matrix dark regions) of the sub-pixels 40 caused by the presence of the black matrix and then avoiding aggravation of moire defects due to the presence of the black matrix.

One embodiment of the present application further provides a display device, including the array substrate provided in the foregoing embodiments, a counter substrate, and a liquid crystal layer. The array substrate and the counter substrate are disposed opposite to each other. The liquid crystal layer is located between the array substrate and the counter substrate. The counter substrate includes: a second substrate 36, and an array of color resist patterns 361 on the second substrate 361. Among the multiple color resist patterns, the color resist patterns adjacent to each other in the first direction are in contact with each other.

Exemplarily, among the multiple color resist patterns, several color resist patterns that are adjacent in the first direction and have the same color form an integrated structure, and there is no black matrix between adjacent color resist patterns in the several color resist patterns.

Exemplarily, the multiple color resist patterns include a red color resist pattern, a green color resist pattern, and a blue color resist pattern.

Exemplarily, the color resist patterns located in the same row along the first direction have the same color and form one color resist unit.

Exemplarily, along the second direction, the red color resist unit, the green color resist unit, and the blue color resist unit are alternately arranged.

Exemplarily, a common electrode layer is further provided on one side of the color filter substrate facing the array substrate.

Exemplarily, an upper polarizer 37 is further provided on one side of the second substrate 36 facing away from the array substrate.

Exemplarily, the display device provided in the foregoing embodiment is suitable for a vertical electric field driven liquid crystal display mode, such as TN or ECB display mode.

It should be noted that, in order to show the technical points of the present application more clearly, a TFT array layer for controlling pixel units on the array substrate as well as alignment layers on the array substrate and the counter substrate are not shown in FIG. 3. Meanwhile, spacers supporting a cell thickness and sealant connecting the array substrate to the counter substrate are also not shown.

It should be noted that the display device may be any product or component with a display function, such as a TV, a monitor, a digital photo frame, a mobile phone, and a tablet computer.

In the display device provided in the embodiment of the present application, since the signal line on the array substrate has good light transmittance and will not interfere with deflection of liquid crystal molecules, thereby ensuring display continuity. Therefore, in one color resist unit of the color filter substrate, adjacent color resist patterns may be in direct contact, that is, there is no need to provide a black matrix between adjacent color resist patterns (i.e., at positions corresponding to positions between adjacent sub-pixels 40), thereby avoiding discontinuity of light emission (i.e., generating black matrix dark regions) of the sub-pixels 40 caused by the presence of the black matrix and then avoiding aggravation of moire defects due to the presence of the black matrix.

In some embodiments, the array substrate includes a wire-grid structure 34. The display device further includes: a polarizer (i.e., an upper polarizer 37) disposed on one side of the counter substrate facing away from the array substrate. An extension direction of a transmission axis of the polarizer is perpendicular to an extension direction of a first wire-grid pattern or a second wire-grid pattern in the wire-grid structure 34.

The extension direction of the transmission axis of the upper polarizer 37 is perpendicular to the extension direction of the first wire-grid pattern or the second wire-grid pattern of the wire-grid structure 34, so that an extension direction of a transmission axis of the wire-grid structure 34 is perpendicular to the extension direction of the transmission axis of the upper polarizer 37, thereby enabling the wire-grid structure 34 to be reused as a lower polarizer, and then eliminating the need for a lower polarizer disposed on one side of the first substrate 30 facing away from the counter substrate in the array substrate, which facilitates reduction of the thickness of the display device.

It should be noted that the various embodiments in this specification are described in a progressive manner, and the same or similar parts between the various embodiments can be referred to each other, and each embodiment focuses on differences from other embodiments. In particular, for the method embodiment, since it is basically similar to the product embodiment, the description is relatively simple, and the relevant part can refer to the part of the description of the product embodiment.

Those skilled in the art can understand that steps, measures, or solutions in various operations, methods or processes that have been discussed in the present disclosure may be alternated, changed, combined, or deleted. Further, other steps, measures, or solutions in various operations, methods or processes that have been discussed in the present disclosure can be alternated, modified, rearranged, decomposed, combined, or deleted. Further, steps, measures, or solutions in various operations, methods or processes in the conventional technologies can be alternated, modified, rearranged, decomposed, combined, or deleted.

In the descriptions of the present disclosure, it needs to be understood that orientation or positional relationship indicated by the term of "center", "up", "down", "front", "rear", "left", "right", "vertical", "horizontal", "top", "bottom", "inside", or "outer", etc., is based on the drawings, and are only for the convenience of describing the present disclosure and simplifying the description, and not intended to indicate or imply that the device or element as referred to must have a specific orientation or be constructed and operated in a specific orientation, and therefore cannot be understood as a limitation to the present disclosure.

The terms "first" and "second" are used for descriptive purposes only, and cannot be understood as indicating or implying relative importance or implicitly indicating the quantity of technical features as referred to. Therefore, the features defined by "first" and "second" may explicitly or implicitly include one or more of the features. In the descriptions of the present disclosure, unless otherwise stated, "a plurality" means two or more.

In the description of the present disclosure, it should be noted that the term of "installation", "connected", or "connecting" should be understood in a broad sense unless explicitly stated and limited. For example, it may be fixed or removable connection, or may be integral connection; it may be direct connection or indirect connection through an intermediate medium, or, it may be internal communication of two elements. For those of ordinary skill in the art, the specific meanings of the above terms in the present disclosure may be understood on a case-by-case basis.

In the descriptions of this specification, specific features, structures, materials, or characteristics may be combined in a suitable manner in any one or more embodiments or examples.

The above descriptions are merely some embodiments of the present disclosure. It should be noted that for those of ordinary skill in the art, without departing from the principles of the present disclosure, various improvements and modifications can be made. These improvements and modifications should fall within the protection scope of the present disclosure.

What is claimed is:

1. An array substrate, comprising:
   a first substrate; and
   a plurality of signal lines on the first substrate;
   wherein the plurality of signal lines are arranged along a first direction; at least one of the plurality of signal lines include a plurality of signal sub-lines arranged at intervals along the first direction, the plurality of signal sub-lines are electrically connected, each of the plurality of signal sub-lines extends along a second direction, and the second direction intersects the first direction,
   wherein the at least one of the plurality of signal lines further includes a transparent conductive layer; the transparent conductive layer is at one side of the plurality of signal sub-lines facing away from the first substrate; and the transparent conductive layer is electrically connected to the plurality of signal sub-lines, respectively,
   wherein the array substrate further includes:
   a plurality of pixel aperture regions arranged in an array on the first substrate;
   a wire-grid structure, wherein the wire-grid structure and the plurality of signal lines are arranged in the same layer and made of the same material, the wire-grid structure is insulated from the plurality of signal lines, and an orthographic projection of the wire-grid structure onto the first substrate is at least partially overlapped with an orthographic projections of the plurality of pixel aperture regions onto the first substrate;
   a plurality of pixel electrodes; at least some of the plurality of pixel electrodes are corresponding to the plurality of pixel aperture regions in a one to one manner; and an orthographic projection of the pixel electrode onto first substrate is at least partially overlapped with an orthographic projection of corresponding one pixel aperture region onto the first substrate,
   the wire-grid structure and the plurality of pixel electrodes are arranged at different layers and isolated from each other.

2. The array substrate according to claim 1, wherein at least one part of the transparent conductive layer is filled between adjacent ones of the plurality of signal sub-lines.

3. The array substrate according to claim 1, wherein the at least one of the plurality of signal lines further includes a conductive connection portion; the conductive connection portion is electrically connected to first ends of the plurality of signal sub-lines, respectively; and/or, the conductive connection portion is electrically connected to second ends of the plurality of signal sub-lines, respectively.

4. The array substrate according to claim 3, wherein the conductive connection portion and the plurality of signal sub-lines are formed as an integral structure.

5. The array substrate according to claim 1, wherein the plurality of pixel aperture regions are divided into a plurality of columns of pixel aperture regions, and each column of pixel aperture regions includes a plurality of pixel aperture regions arranged along the second direction;
   the wire-grid structure includes a plurality of first wire-grid patterns arranged at intervals along the first direction; each of the plurality of first wire-grid patterns extends along the second direction; the plurality of first wire-grid patterns are divided into a plurality of first wire-grid pattern groups; at least some of the first wire-grid pattern groups are corresponding to the plurality of columns of pixel aperture region in a one-to-one manner; and an orthographic projection of the first wire-grid pattern group onto the first substrate is at least partially overlapped with an orthographic projection of corresponding one column of pixel aperture regions onto the first substrate.

6. The array substrate according to claim 1, wherein the wire-grid structure includes a plurality of second wire-grid patterns; each of the plurality of second wire-grid patterns extends along the second direction; the plurality of second wire-grid patterns are divided into a plurality of groups of second wire-grid pattern groups; and each of the plurality of second wire-grid pattern groups includes a plurality of second wire-grid patterns arranged at intervals along the first direction;
   at least some of the plurality of second wire-grid pattern groups are corresponding to the plurality of pixel aperture regions in a one-to-one manner; and an orthographic projection of the second wire-grid pattern group onto the first substrate is at least partially overlapped with an orthographic projection of corresponding one pixel aperture region onto the first substrate.

7. The array substrate according to claim 1, wherein the plurality of pixel electrodes includes a plurality of first pixel electrodes and a plurality of second pixel electrodes; the first pixel electrode and the second pixel electrode are in different layers; the second pixel electrode is closer to the first substrate than the first pixel electrode;
   the plurality of first pixel electrodes are divided into a plurality of columns of first pixel electrodes; each column of the first pixel electrodes includes a plurality of first pixel electrodes arranged along the second direction; the plurality of second pixel electrodes are divided into a plurality of columns of second pixel electrodes, each column of second pixel electrodes includes a plurality of second pixel electrodes arranged along the second direction; and an orthographic projection of one column of first pixel electrodes onto the first substrate, and an orthographic projection of one column of second pixel electrodes onto the first substrate are alternately arranged along the first direction.

8. The array substrate according to claim 7, wherein the plurality of pixel aperture regions are divided into a plurality of columns of pixel aperture regions, and each column of pixel aperture regions includes a plurality of pixel aperture regions arranged along the second direction;

an orthographic projection of the signal line onto the first substrate is at least partially overlapped with an orthographic projection of one column of pixel aperture regions onto the first substrate, and is at least partially overlapped with an orthographic projection of one column of second pixel electrodes corresponding to another column of pixel aperture regions which is adjacent to the one column of pixel aperture regions, onto the first substrate.

9. The array substrate according to claim 7, wherein the array substrate further includes a first passivation layer and a second passivation layer; the first passivation layer is located between the second pixel electrode and the signal line; and the second passivation layer is located between the first pixel electrode and the second pixel electrode.

10. The array substrate according to claim 9, wherein in the first pixel electrode and the second pixel electrode that are adjacent in the first direction, an orthographic projection of the second pixel electrode onto the first substrate is at least partially overlapped with an orthographic projection of the first pixel electrode onto the first substrate.

11. The array substrate according to claim 9, wherein in the first pixel electrode and the second pixel electrode that are adjacent in the first direction, a length of the second pixel electrode in the first direction is greater than a length of the first pixel electrode in the first direction.

12. The array substrate according to claim 1, wherein the orthographic projection of the pixel aperture region onto the first substrate is within the orthographic projection of the corresponding one pixel electrode onto first substrate.

13. The array substrate according to claim 1, wherein the signal line includes a data line.

14. A display device, comprising:
an array substrate;
a counter substrate; and
a liquid crystal layer;
wherein the array substrate and the counter substrate are arranged opposite to each other, and the liquid crystal layer is between the array substrate and the counter substrate;
the array substrate includes: a first substrate, and a plurality of signal lines on the first substrate; the plurality of signal lines are arranged along a first direction; at least one of the plurality of signal lines include a plurality of signal sub-lines arranged at intervals along the first direction, the plurality of signal sub-lines are electrically connected, each of the plurality of signal sub-lines extends along a second direction, and the second direction intersects the first direction; wherein the at least one of the plurality of signal lines further includes a transparent conductive layer; the transparent conductive layer is at one side of the plurality of signal sub-lines facing away from the first substrate; and the transparent conductive layer is electrically connected to the plurality of signal sub-lines, respectively, wherein the array substrate further includes: a plurality of pixel aperture regions arranged in an array on the first substrate; a wire-grid structure, wherein the wire-grid structure and the plurality of signal lines are arranged in the same layer and made of the same material, the wire-grid structure is insulated from the plurality of signal lines, and an orthographic projection of the wire-grid structure onto the first substrate is at least partially overlapped with an orthographic projections of the plurality of pixel aperture regions onto the first substrate; and a plurality of pixel electrodes; at least some of the plurality of pixel electrodes are corresponding to the plurality of pixel aperture regions in a one to one manner; and an orthographic projection of the pixel electrode onto first substrate is at least partially overlapped with an orthographic projection of corresponding one pixel aperture region onto the first substrate, wherein the wire-grid structure and the plurality of pixel electrodes are arranged at different layers and isolated from each other, the counter substrate includes: a second substrate, and a plurality of color resist patterns arranged in an array on the second substrate; and among the plurality of color resist patterns, the color resist patterns adjacent to each other along the first direction are in contact with each other.

15. The display device according to claim 14, wherein the display device further includes: a first polarizer disposed on one side of the counter substrate facing away from the array substrate; an extension direction of a transmission axis of the first polarizer is perpendicular to an extension direction of a first wire-grid pattern or a second wire-grid pattern in the wire-grid structure.

16. The display device according to claim 15, wherein the wire-grid structure is reused as a second polarizer; and extension directions of transmission axes of the second polarizer and the first polarizer are perpendicular to each other.

17. The display device according to claim 14, wherein among the plurality of color resist patterns, the color resist patterns adjacent to each other in the first direction are in direct contact with each other.

* * * * *